(12) United States Patent
Rong et al.

(10) Patent No.: US 11,347,921 B2
(45) Date of Patent: May 31, 2022

(54) SIGNAL INTEGRITY SIMULATION METHOD FOR ENCRYPTION HYBRID MODEL

(71) Applicant: ZHENGZHOU YUNHAI INFORMATION TECHNOLOGY CO., LTD., Henan (CN)

(72) Inventors: Shili Rong, Henan (CN); Lin Wang, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 391 days.

(21) Appl. No.: 16/493,266

(22) PCT Filed: Oct. 26, 2018

(86) PCT No.: PCT/CN2018/112050
§ 371 (c)(1),
(2) Date: Sep. 11, 2019

(87) PCT Pub. No.: WO2019/223234
PCT Pub. Date: Nov. 28, 2019

(65) Prior Publication Data
US 2021/0357563 A1   Nov. 18, 2021

(30) Foreign Application Priority Data
May 23, 2018 (CN) .......................... 201810501722.3

(51) Int. Cl.
G06F 30/367 (2020.01)
G06F 30/30 (2020.01)
G06F 30/3308 (2020.01)

(52) U.S. Cl.
CPC ........ *G06F 30/367* (2020.01); *G06F 30/3308* (2020.01)

(58) Field of Classification Search
None
See application file for complete search history.

(56) References Cited

U.S. PATENT DOCUMENTS

| | | | |
|---|---|---|---|
| 9,928,318 B1* | 3/2018 | Kukal | ..................... G06F 30/33 |
| 2019/0325101 A1* | 10/2019 | Rong | ................... G06F 30/367 |

FOREIGN PATENT DOCUMENTS

| | | |
|---|---|---|
| CN | 102314532 A | 1/2012 |
| CN | 107292066 A | 10/2017 |
| CN | 107506540 A | 12/2017 |

OTHER PUBLICATIONS

R.H.G. Cuny, "SPICE and IBIS Modeling Kits—The Basis for Signal Integrity Analyses," 1996 IEEE, pp. 204-208. (Year: 1996).*

(Continued)

*Primary Examiner* — Leigh M Garbowski
(74) *Attorney, Agent, or Firm* — Yue (Robert) Xu; Apex Attorneys at Law, LLP (57) ABSTRACT

A signal integrity simulation method for an encryption hybrid model is provided. A step response data of a SPICE model is extracted through a transient simulation. An external random code signal is generated. The extracted step response data is imported as an input source for an ADS channel simulator. An eye diagram at a RX end is calculated by the ADS channel simulator based on an algorithm and the external random code signal, to perform measurement on the eye diagram. With the signal integrity simulation method for an encryption hybrid model such as an IBIS AMI model, the problem that signal integration simulation cannot be accurately performed or cannot be performed because models provided by the manufacturer are encrypted or the types of models provided by the manufacturer are not consistent can be effectively solved.

3 Claims, 7 Drawing Sheets

(56) References Cited

OTHER PUBLICATIONS

ADS 2009, "Channel Simulation," Keysight Technologies Incorporated, 50 pages. (Year: 2009).*
ADS 2009, "About IBIS Models," Keysight Technologies Incorporated, 19 pages. (Year: 2009).*
"Cosimulation," Agilent Technologies, Advanced Design System 2011, 32 pages. (Year: 2011).*
S. Mazzocchi et al., "Channel Analysis of High Speed Digital Module and Correlation between Simulations and Measurements," 2013 IEEE, 4 pages. (Year: 2013).*
International Search Report for PCT/CN2018/112050 dated Feb. 27, 2019, ISA/CN.

* cited by examiner

SIGNAL INTEGRITY SIMULATION METHOD FOR ENCRYPTION HYBRID MODEL

The present application is the national phase of International Patent Application No. PCT/CN2018/112050, titled "SIGNAL INTEGRITY SIMULATION METHOD FOR ENCRYPTION HYBRID MODEL", filed on Oct. 26, 2018, which claims the priority to Chinese Patent Application No. 201810501722.3, titled "SIGNAL INTEGRITY SIMULATION METHOD FOR ENCRYPTION HYBRID MODEL", filed on May 23, 2018 with the Chinese Patent Office, both of which are incorporated herein by reference in its entirety their entireties.

TECHNICAL FIELD

The present disclosure relates to the technical field of high-speed signal quality evaluation, and in particular to a signal integrity simulation method for an encryption hybrid model.

BACKGROUND

With the continuous development of computer technologies, a high speed interconnection phenomenon is playing a leading role in many factors that reflect the performance of digital systems. In the previous high-speed system designs, a method of "wiring-simulation-rewiring" is often adopted, which requires a design engineer to perform wiring and then perform simulation operations. If an error is found after performing the wiring, it is required to find the cause and modify the design, and then perform the above process of "wiring-simulation-rewiring" again.

In order to meet a design requirement, much time may be taken with this design. Therefore, a design engineer has to use an appropriate method and analysis simulation tool in early design stage to assess the feasibility and risk points of the system design in advance, and optimize the design based on the simulation result, to improve success rate of the system design and shorten a development cycle.

However, some chip manufacturers encrypt their chip models, and there are also some cases that an actual type a chip model is not consistent with a given type of the chip model, which may increase the simulation difficulty and reduce the simulation accuracy in a simulation process of the early design stage, and even make the simulation cannot be performed normally. In this case, it may be impossible to effectively evaluate link characteristics, which may increase risks in the design.

In the conventional technical solution, a universal chip model is used to approximately replace the chip model in the link, to approximately assess the link characteristics of the system design. Although this approximation can realize link simulation, it cannot guarantee the accuracy of the simulation. Especially when the link margin is very small, this simulation method is not very meaningful.

Therefore, it is required to provide a signal integrity simulation method for an encryption hybrid model.

SUMMARY

A signal integrity simulation method for an encryption hybrid model is provided according to the embodiments of the present disclosure, which includes:
extracting a step response data of a SPICE model through a transient simulation;
generating an external random code signal;
importing the extracted step response data as an input source for an ADS channel simulator; and
calculating, by the ADS channel simulator, an eye diagram at a RX end based on an algorithm and the external random code signal, to perform measurement on the eye diagram.

DETAILED DESCRIPTION OF THE EMBODIMENTS

The embodiments of the present disclosure are described in conjunction with drawings.

First Embodiment

In the embodiment, a signal integrity simulation method for an encryption hybrid model is provided, which includes:
extracting a step response data of a SPICE model through a transient simulation;
generating an external random code signal;
importing the extracted step response data as an input source of an ADS channel simulator; and
calculating, by the ADS channel simulator, an eye diagram at a RX end based on an algorithm and the external random code signal, to perform measurement on the eye diagram.

In the embodiment, a link verification is formed before performing the transient simulation, where the link verification is formed by connecting a TX end to the RX end via a wiring model. A chip at the TX end is a SPICE model that is encrypted, and a step response generated by the chip at the TX end includes all characteristics of the chip at the TX end. A chip at the RX end is an IBIS AMI model. The SPICE model at the TX end is a RC circuit.

In the embodiment, the SPICE model at the TX end is not encrypted. In this case, the simulation method includes the following steps 1) to 5).

In step 1), the SPICE model is imported based on a Spice Wizard function of ADS. The SPICE model at the TX end that is not encrypted is capable of being directly called by the ADS. An input interface is reserved for the SPICE model, to input a step signal outside the SPICE model.

In step 2), a link model is established.

In step 3), a transient step response simulation is performed. The imported SPICE model is connected to a wiring model, and a resistor of 50 ohm is joined at an end of the verification link. An ideal step signal is inputted at the input interface reserved for the SPICE model, a simulation time is set to make an output of the step response be in a steady state, and a simulation time interval is set to guarantee calculation accuracy. The step response data is extracted at a position where the resistor is joined, where the step response data includes the characteristics of the chip at the TX end and the verification link.

In step 4), a channel simulation is performed. The step response data obtained in step 3) is imported into the channel simulation as a signal source at the RX end, and the external random code signal is inputted, and parameters related to the channel simulation are set.

In step 5), simulation results are verified. A channel simulation result obtained in step 4) is compared with a transient simulation result, to verify consistency between the channel simulation result and the transient simulation result.

Second Embodiment

In the embodiment, a signal integrity simulation method for an encryption hybrid model is provided. In the embodiment, the SPICE model at the TX end is encrypted. In this case, the simulation method includes the following steps 1) to 3).

In step 1), a transient simulation based on HSPICE is performed. A transient step response simulation is performed on the encrypted SPICE model and the verification link to obtain a step response output file with a suffix of .lis. A format of the step response output file is edited to form a file with a suffix of .tim that is capable of being called by ADS.

In step 2), An active simulation is performed. The step response data (.tim) is imported into the ADS for the active simulation, and the active simulation is performed by calling the step response data in the ADS based on the external random code signal. An input interface is reserved for the SPICE model, to input a step signal outside the SPICE model. A signal resource at the RX end is imported into the channel simulation, and the external random code signal is inputted, and parameters related to the active simulation are set.

In step 3), simulation results are verified. A transient simulation result is compared with an active simulation result obtained in step 2) to verify consistency between the transient simulation result and the active simulation result.

Third Embodiment

Figure 1:
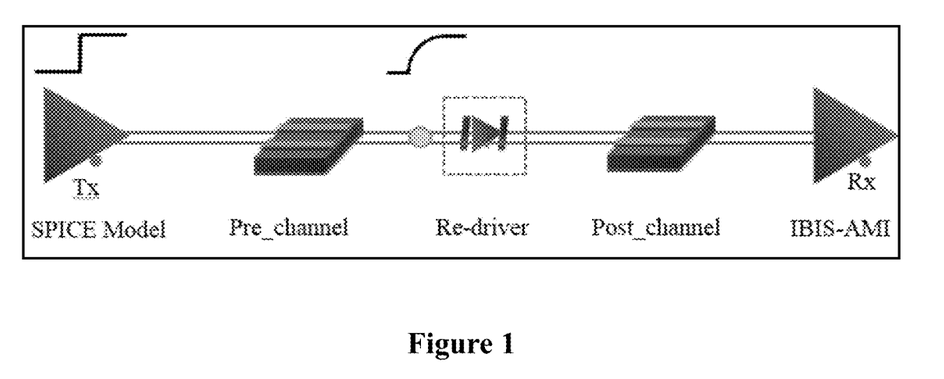
FIG. 1 is a schematic diagram of a simulation link according to a third embodiment of the present disclosure.

In the embodiment, a simulation link is as shown in FIG. 1, a chip at a TX end is a SPICE model that is encrypted, a chip of a relay system and a chip at a RX end are IBIS AMI models, and Pre_channel and Post_channel in a link are both PCB wiring models of 5 inch length. The TX end is provided with a PEX9797 chip from the company Broadcom, the Re-driver is a DS80PCI800 chip from the company TI, and the RX end is provided with a CPU model from the company Intel.

Figure 2:
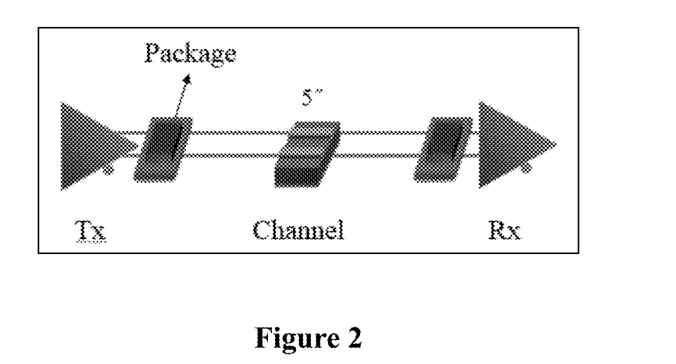
FIG. 2 is a schematic diagram of a simulation verification link according to the third embodiment of the present disclosure.

Since the SPICE model and the IBIS AMI model cannot exist in the simulation link together, the verification link shown in FIG. 2 is simulated and verified first, where the chips at the TX end and the RX end are SPICE model and IBIS AMI model respectively, the SPICE model at the TX end is a RC circuit, and the link only includes a PCB wire of 5 inch length.

In the embodiment, assuming that the SPICE model at the TX end is not encrypted, the simulation method includes the following steps 1) to 5).

In step 1), the SPICE model is imported. The SPICE model is imported based on a Spice Wizard function of ADS. In the embodiment, since the SPICE model at the TX end is not encrypted, the SPICE model may be called directly by the ADS. This step cannot be performed if the SPICE model is encrypted. An input interface is reserved for the SPICE model, to input a step signal outside the SPICE model.

In step 2), a link model is established. In the embodiment, it is only required to establish a wiring model of 5 inch length. Because of different extraction manners of the wiring model in actual projects, the wiring model may be transformed into an S parameter for the ADS to call in other embodiments of the present disclosure. In the embodiment, Pre_channel and Post_channel are both wiring models of 5 inch length.

In step 3), a transient step response simulation is performed. The imported SPICE model is connected to the wiring model of 5 inch length, and a resistor of 50 ohm is joined at an end of a link. An ideal step signal is inputted at the input interface reserved for the SPICE model, and an amplitude of the ideal step signal is determined depending on the chip characteristics. A simulation time is set to make an output of the step response be in a steady state, and a simulation time interval is set to guarantee calculation accuracy. The step response data is extracted at a position where the resistor is joined, and the step response data includes all the characteristics of the chip at the TX end and the link.

In step 4), a channel simulation is performed. The above step response data is imported into the channel simulation as a signal source of the chip at the RX end, and an external random code signal is inputted. The step response data includes the characteristics of the chip at the TX end and the link, and the external random code signal is inputted to generate an eye diagram. Relevant parameters, such as a simulation frequency, a code source type, equalization, are set for channel simulation, and the parameters are set according to actual situations. In the embodiment, a PCIE Gen3 signal is used, thus the frequency is set to be 8G.

In step 5), the simulation results are verified. A channel simulation result obtained in step 4) is compared with a transient simulation result, to verify the feasibility and accuracy of the method.

Figure 3:
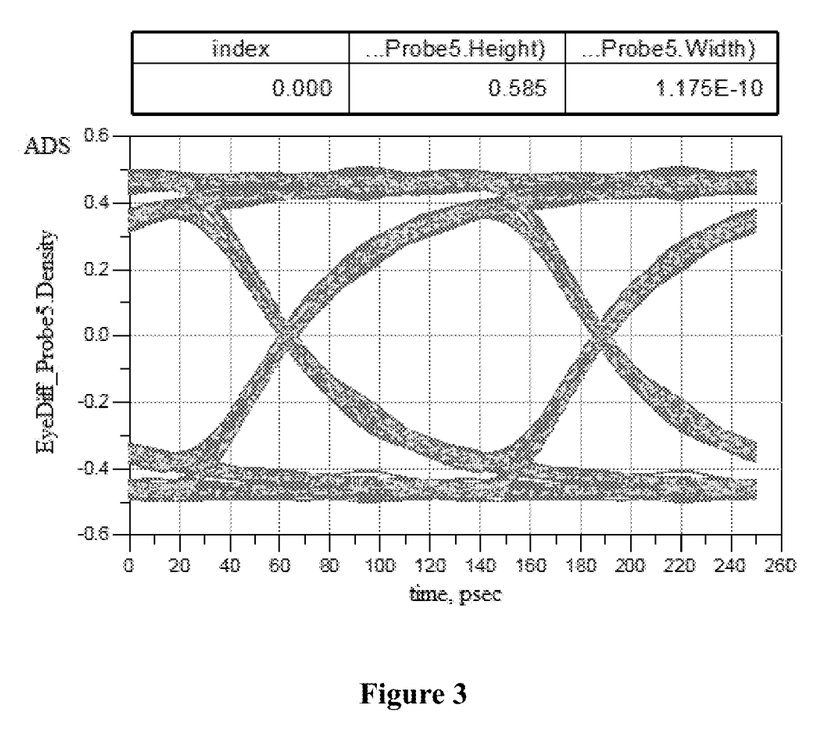
FIG. 3 is an analysis diagram of an eye diagram of an transient simulation result according to the third embodiment of the present disclosure.

The simulation result based on the transient simulation method is as shown in FIG. 3, in which an eye diagram at a test point and parameters such as an eye height and an eye width are shown.

Figure 4:
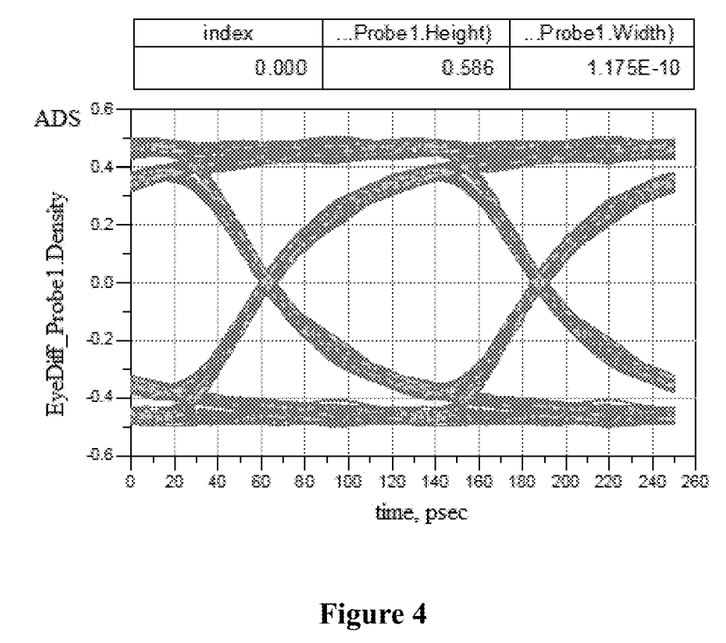
FIG. 4 is an analysis diagram of an eye diagram of a hybrid model simulation method according to the third embodiment of the present disclosure.

A result based on the above hybrid model simulation method is as shown in FIG. 4, in which a detection point of the eye diagram is at a front end of a receiving chip.

Compared among the above simulation results, it can be seen that the simulation result based on the step response is almost consistent with the transient simulation result, which verifies the effectiveness of performing channel simulation by using the step response of the chip.

Embodiment 4

In the embodiment, assuming that SPICE model at the TX end is encrypted, the simulation method includes the following steps 1) to 2).

In step 1), a transient simulation based on HSPICE is performed. A transient step response simulation is performed on the encrypted SPICE model and the verification link (a wire of 5 inches) to obtain a step response output file with a suffix of .lis. A format of the step response output file is edited to form a file with a suffix of .tim that is capable of being called by the ADS.

In step 2), the step response data (.tim) is imported into the ADS for an active simulation. The active simulation is performed by calling the step response data in the ADS based on the external random code signal.

Figure 5:
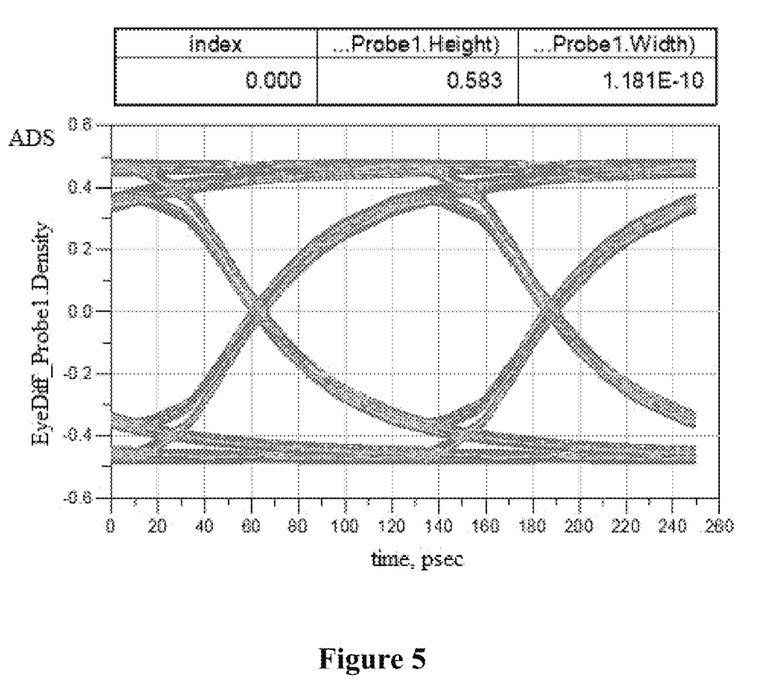
FIG. 5 is an analysis diagram of an eye diagram of a channel simulation result based on a HSPICE step response according to a fourth embodiment of the present disclosure.
Figure 6:
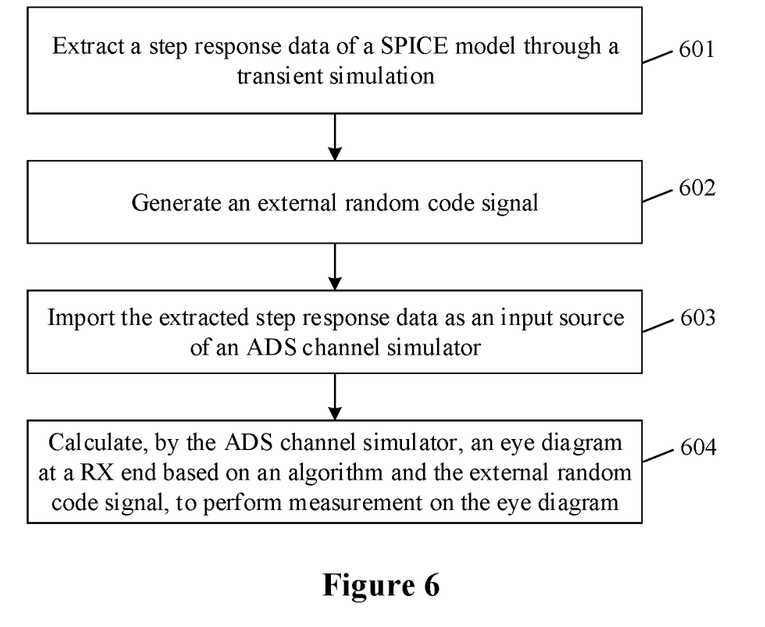
FIG. 6 is a schematic flowchart of a signal integrity simulation method for an encryption hybrid model according to a First embodiment of the present disclosure.
Figure 7:
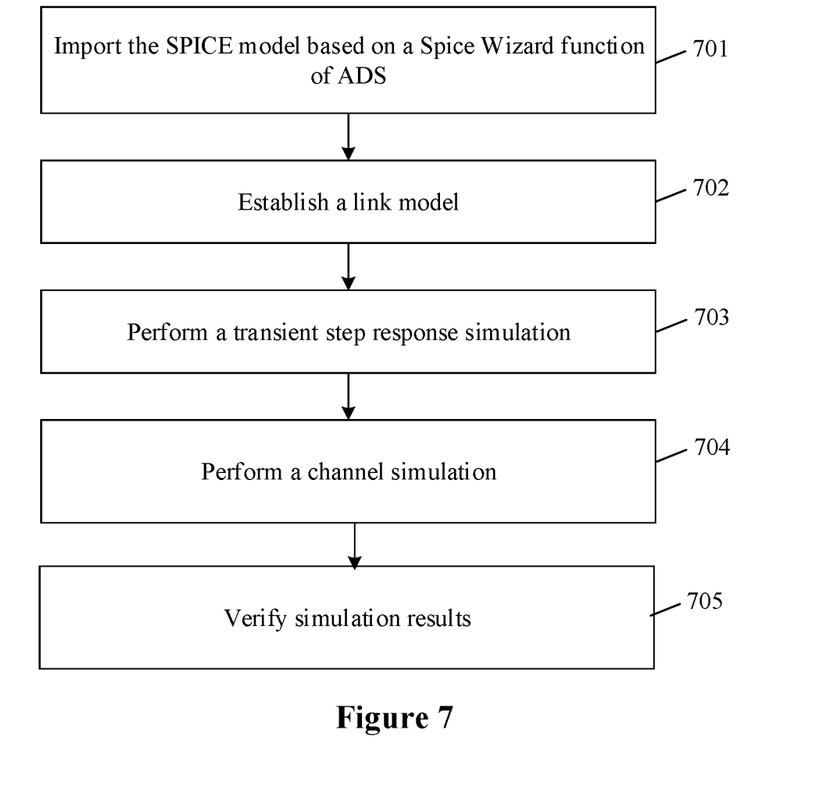
FIG. 7 is a schematic flowchart of a signal integrity simulation method for an encryption hybrid model according to a First embodiment of the present disclosure in a case that the SPICE model at the TX end is not encrypted.
Figure 8:
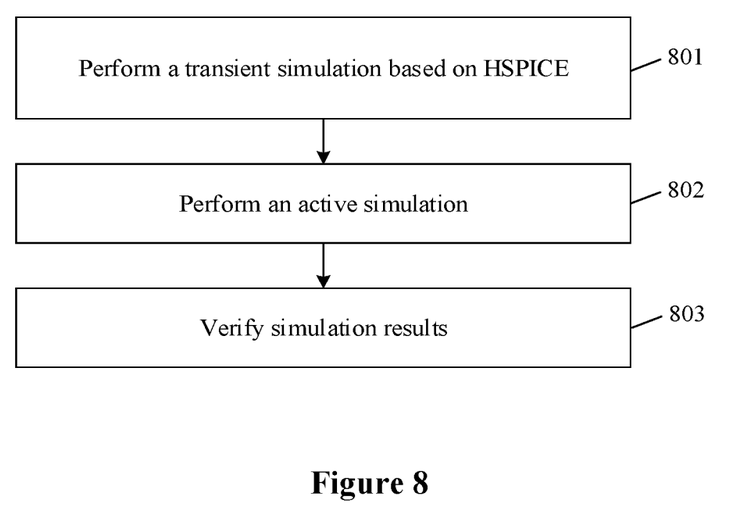
FIG. 8 is a schematic flowchart of a signal integrity simulation method for an encryption hybrid model according to a Second embodiment of the present disclosure.

The simulation result obtained with the above simulation method are as shown in FIG. 5, where the detection point of the eye diagram is at the front end of the receiving chip. Compared with FIGS. 3 and 4, it can be seen that the simulation result obtained with the simulation method according to the present disclosure is very close to the result obtained under an ideal condition, and the error is controlled at about 0.5%, which verifies the effectiveness of the simulation method according to the present disclosure.

The above are only preferred embodiments of the present disclosure. Those skilled in the art, based on the application method and principle of the present disclosure, can easily make possible variations and modifications to the technical solutions of the present disclosure, not limited to the methods described in the above embodiments of the present disclosure. Therefore, the methods described above is only preferred, and the present disclosure is not limited to the embodiments described herein.

The invention claimed is:

1. A signal integrity simulation method for an encryption hybrid model, comprising:
   extracting a step response data of a SPICE model through a transient simulation;
   generating an external random code signal;
   importing the extracted step response data as an input source of an ADS channel simulator; and
   calculating, by the ADS channel simulator, an eye diagram at a RX end based on an algorithm and the external random code signal, to perform measurement on the eye diagram,
   wherein
   a verification link is formed before performing the transient simulation, and the verification link is formed by connecting a TX end to the RX end via a wiring model, and wherein
   a chip at the TX end is a SPICE model that is encrypted, and a step response generated by the chip at the TX end comprises all characteristics of the chip at the TX end, and a chip at the RX end is an IBIS AMI model, and the SPICE model at the TX end is a RC circuit.

2. The signal integrity simulation method for an encryption hybrid model according to claim 1, wherein in a case that the SPICE model at the TX end is not encrypted, the simulation method comprises the following steps of:
   1) importing the SPICE model based on a Spice Wizard function of ADS, wherein the SPICE model at the TX end that is not encrypted is capable of being directly called by the ADS; and reserving an input interface for the SPICE model, to input a step signal outside the SPICE model;
   2) establishing a link model;
   3) performing a transient step response simulation, wherein the imported SPICE model is connected to a wiring model, and a resistor of 50 ohm is joined at an end of the verification link; inputting an ideal step signal at the input interface reserved for the SPICE model, wherein a simulation time is set to make an output of the step response be in a steady state, and a simulation time interval is set to guarantee calculation accuracy; and extracting the step response data at a position where the resistor is joined, wherein the step response data comprises the characteristics of the chip at the TX end and the verification link;
   4) performing a channel simulation, wherein the step response data obtained in step 3) is imported into the channel simulation as a signal source at the RX end, and the external random code signal is inputted, and parameters related to the channel simulation are set; and
   5) verifying simulation results, wherein a channel simulation result obtained in step 4) is compared with a transient simulation result, to verify consistency between the channel simulation result and the transient simulation result.

3. The signal integrity simulation method for an encryption hybrid model according to claim 1, wherein in a case that the SPICE model at the TX end is encrypted, the simulation method comprises the following steps of:
   1) performing a transient simulation based on HSPICE, wherein a transient step response simulation is performed on the encrypted SPICE model and the verification link to obtain a step response output file with a suffix of .lis; and editing a format of the step response output file to form a file with a suffix of .tim that is capable of being called by ADS;
   2) performing an active simulation, wherein the step response data (.tim) is imported into the ADS for the active simulation, and wherein the active simulation is performed by calling the step response data in the ADS based on the external random code signal; and
   3) verifying simulation results, wherein a transient simulation result is compared with an active simulation result obtained in step 2) to verify consistency between the transient simulation result and the active simulation result.

* * * * *